United States Patent
Roche et al.

(10) Patent No.: US 6,924,172 B2
(45) Date of Patent: Aug. 2, 2005

(54) METHOD OF FORMING A BOND PAD

(75) Inventors: Thomas S. Roche, Scottsdale, AZ (US); Paule C. Aschieri, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 29 days.

(21) Appl. No.: 10/649,426

(22) Filed: Aug. 26, 2003

(65) Prior Publication Data

US 2005/0048755 A1 Mar. 3, 2005

(51) Int. Cl.[7] ................................................ H01L 21/44
(52) U.S. Cl. ...................... 438/106; 438/127; 438/612; 438/688
(58) Field of Search ................................ 438/688, 106, 438/127, 612

(56) References Cited

U.S. PATENT DOCUMENTS 6,200,910 B1    3/2001   O'Brien
6,538,323 B1 *  3/2003   Sakata et al. ............... 257/737

OTHER PUBLICATIONS

Danzl, Ralph B. et al.; "The Use of Concentrated Hydrogen Peroxide for the Removal of a TiW ARC from Aluminum Bond Pads"; Electronics Manufacturing Technology Symposium, 1997, Twenty–First IEEE/CPMT International, Oct. 13–15, 1997; pp 99–109 + cover sheet; IEEE, USA.

* cited by examiner

Primary Examiner—Thanh Nguyen
(74) Attorney, Agent, or Firm—Kim-Marie Vo

(57) ABSTRACT

A top-most layer (64) is formed over a bond pad layer (62) and under a passivation layer (68) and a polyimide layer (72). Openings (70 and 74) are formed within the passivation layer (68) and the polyimide layer (72) to expose the top-most layer (64), which protects the bond pad layer (62) during the formation of the openings (70 and 74). In one embodiment, the exposed top-most layer (64) is selectively etched using hydrogen peroxide and an amine, such as ammonium hydroxide. Because the chemistry does not attack the bond pad layer (62), the bond pad layer's thickness is not decreased and thus, reliability of the bond pad is maintained.

18 Claims, 3 Drawing Sheets

US 6,924,172 B2

METHOD OF FORMING A BOND PAD

FIELD OF THE INVENTION

This invention relates generally to semiconductor devices, and more specifically, to bond pads.

BACKGROUND

Bond pads are used to electrically connect a semiconductor die to a packaging terminal interconnect. A packaging terminal interconnect may be a lead, ball, no lead, combinations of the above or the like. It is important that the signals sent between the semiconductor die and the packaging terminal interconnect are reliable. Much of this depends on the bond pad structure.

Currently, aluminum bond pads are used in much of the industry. Typically, a metal layer of approximately 6,000 Angstroms of aluminum is deposited and patterned as the last metal line in a semiconductor die fabrication process. A passivation layer is formed and patterned over the metal layer. During patterning of the passivation layer, the thickness of the aluminum bond pad can be significantly reduced. The resulting thickness of the metal layer (approximately 1,000–2,000 Angstroms) is too thin to provide adequate electrical reliability.

One proposed solution is to form a TiN layer over the aluminum bond pad to prevent the thinning of the aluminum during processing. However, the TiN layer must be removed prior to bonding in order for the aluminum bond pad to be electrically coupled to the packaging terminal interconnect. However, current TiN dry etch processes attack the underlying metal layer. Thus, the metal layer is thinned during removal of the TiN layer and reliability is poor. Therefore, a need exists for a process that does not thin the metal layer and thus, increases reliability between the semiconductor die and the packaging terminal interconnect.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment, a chemistry including hydrogen, oxygen and carbon is used to etch a TiN layer without etching the underlying bond pad layer, which preferably includes aluminum. The chemistry may be hydrogen peroxide and an amine, such as ammonium hydroxide. Because the chemistry does not attack the bond pad layer, the bond pad layer's thickness is not decreased and thus, reliability of the bond pad is maintained. Besides the improved control over the thickness of the bond pad layer, additional benefits such as scrap reduction, cost reduction, cycle time increase, and the ability to meet customer demands are achieved. The benefits can be better appreciated after an explanation of the process and thus are described in more detail following the discussion below of the figures.

Figure 1:
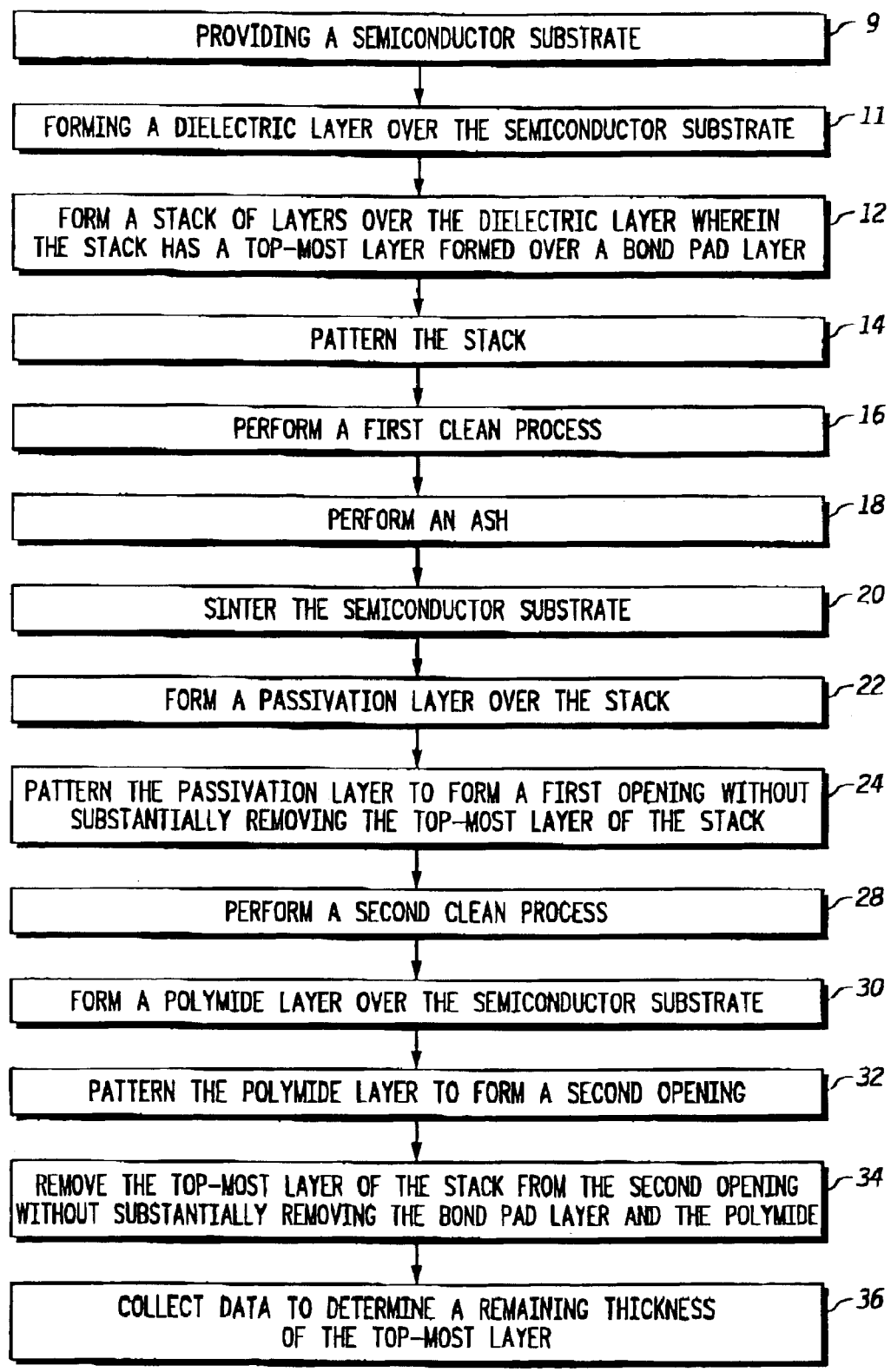
FIG. 1 illustrates a process flow for forming a bond pad in accordance with one embodiment of the present invention.

Illustrated in FIG. 1 is a flow 5 used to form a bond pad in accordance with one embodiment of the present invention. FIGS. 2–6 will be referred to, if appropriate, when discussing the flow 5 of FIG. 1. The first step of the flow 5 is to provide 9 a semiconductor substrate 52, which is shown after additional processing in FIGS. 2–6. The semiconductor substrate can be monocrystalline silicon, gallium arsenide, silicon-on-insulator (SOI), the like, or combinations of the above. Although not shown, the semiconductor substrate may includes various structures, such as transistors, metal layers and the like, as known to one skilled in the art. In the embodiment discussed, the exposed layer of the semiconductor substrate is a metal layer, such as aluminum, copper, and the like.

A dielectric layer 54 (also shown in FIGS. 2–6 after additional processing) is formed 11 over the semiconductor substrate 12 by chemical vapor deposition (CVD), physical vapor deposition (PVD), atomic layer deposition (ALD), the like or combinations of the above. The dielectric layer 54 is an intermetal dielectric (IMD), which isolates metal regions/layers from each another. Thus, the dielectric layer 54 is formed to isolate the exposed layer (not shown) of the semiconductor substrate from subsequently formed conductive layers. Typically, the dielectric layer 54 is silicon dioxide ($SiO_2$), but it can be any dielectric material, such as a low dielectric constant (low-k) material. (A low-k material is a material with a dielectric constant less than that of silicon dioxide.)

Figure 2:
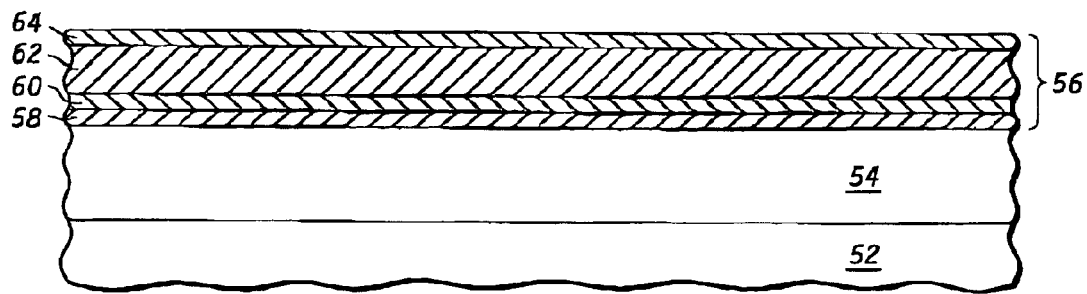
FIG. 2 illustrates a cross-sectional view of a portion of a semiconductor device in accordance with an embodiment of the present invention.

After forming 11 the dielectric layer 54, a stack 56 of layers is formed 12 over the dielectric layer 52 as part of the process of forming a semiconductor device 50, of which a portion is shown in FIG. 2. The stack 56 includes a top-most layer 64 formed over a bond pad (metal) layer 62. In a preferred embodiment, the top-most layer 64 is TiN over a bond pad (metal) layer 62 that includes aluminum. The TiN is at least approximately 800 Angstroms thick as deposited and the aluminum is approximately 6,000 Angstroms thick. In one embodiment, a first barrier layer 58 and a second barrier layer 60 are formed under the bond pad layer 62. In a preferred embodiment, first barrier layer 58 is approximately 200 Angstroms of Ti and the second barrier layer is approximately 600 Angstroms of TiN.

Figure 3:
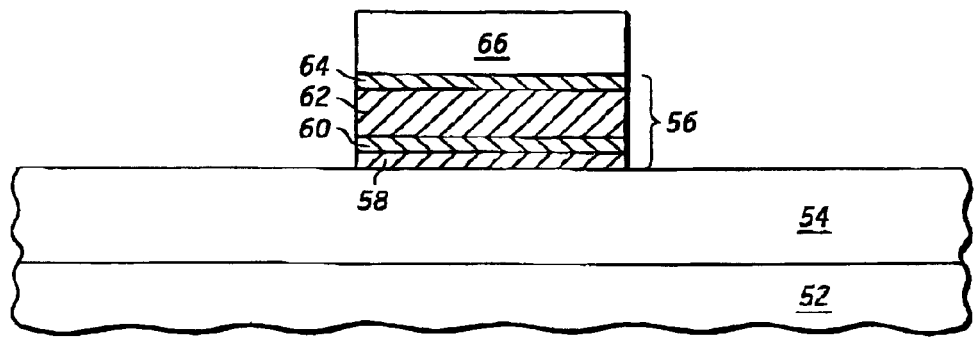
FIG. 3 illustrates the semiconductor device of FIG. 2 after etching various layers.

Illustrated in FIG. 3, after forming the stack 56, that stack 56 is patterned 14 by depositing and patterning a photoresist layer 66 and then etching the stack 56. In one embodiment, the etch chemistry including chlorine (or more specifically $BCl_3$, $Cl_2$, and argon) is used to etch the stack 56 which includes layers of TiN and Ti.

After etching the stack 56, a first clean process (post metal etch clean) is performed 16 to remove any particles that may remain from the etch process. As shown in FIG. 1, after the first clean process, the photoresist is removed using an in situ ash process. An ash is performed by exposing the semiconductor device 50 to an oxygen ($O_2$) plasma environment. Preferably, the clean is a wet process. During the above mentioned processes, some of the top-most layer 64 may be removed, which is the reason why at least approximately 800 Angstroms of TiN as deposited is preferred. Typically, the etch process will remove approximately 100–200 Angstroms of TiN. Thus, at least approximately 600–700 Angstroms remains which is desirable because the subsequently used tetramethylammonium hydroxide (TMAH) may create pinholes in the top-most layer 64 which will allow the TMAH to attack the underlying bond pad layer 62 if less than approximately 600–700 Angstroms of TiN is present as the top-most layer 64.

Next, the semiconductor device 50 (including the semiconductor substrate 52 is sintered 20 to anneal any residual charges created from the etching process.

After sintering 20, a passivation layer 68 is formed 22 over the semiconductor device 50, as described in FIG. 1. The passivation layer 68 is a protective coating that protects underlying layers from particles, scratches and moisture. The passivation layer 68 can be silicon nitride, phosphosilicate glass (PSG) or any other suitable material formed by CVD, PVD, ALD, the like or combinations of the above.

Figure 4:
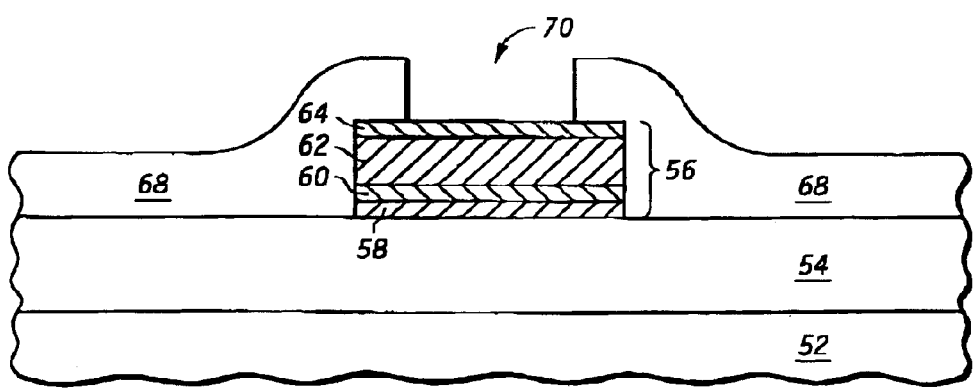
FIG. 4 illustrates the semiconductor device of FIG. 3 after forming and patterning a passivation layer.

As shown in FIG. 4, the passivation layer 68 is then patterned 24 without removing the top-most layer 64 of the stack to form first opening 70 having sidewalls and a bottom, as shown in FIG. 4. In other words, the patterning process for removing portion of the passivation layer 68 is selective to the top-most layer 64. Generally, a dry etch process is used to form the first opening 70 as known to a skilled artisan. The first opening 70 is where the bond pad will be exposed after processing is completed. Typically, the first opening 70 is located near an edge of the semiconductor device 50; the first opening 70 can be located anywhere on the semiconductor device 50. To remove any particles remaining from the etch process, a second clean process is performed 28, as shown in FIG. 1.

Figure 5:
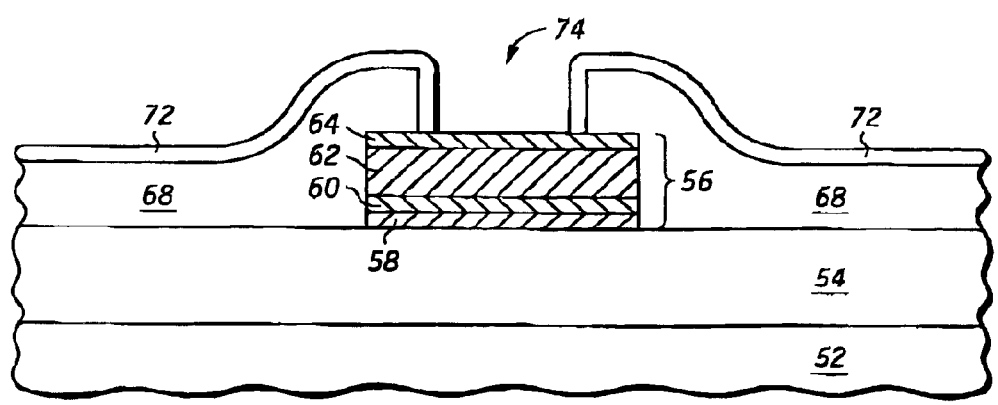
FIG. 5 illustrates the semiconductor device of FIG. 4 after forming and patterning a polyimide layer.
Figure 6:
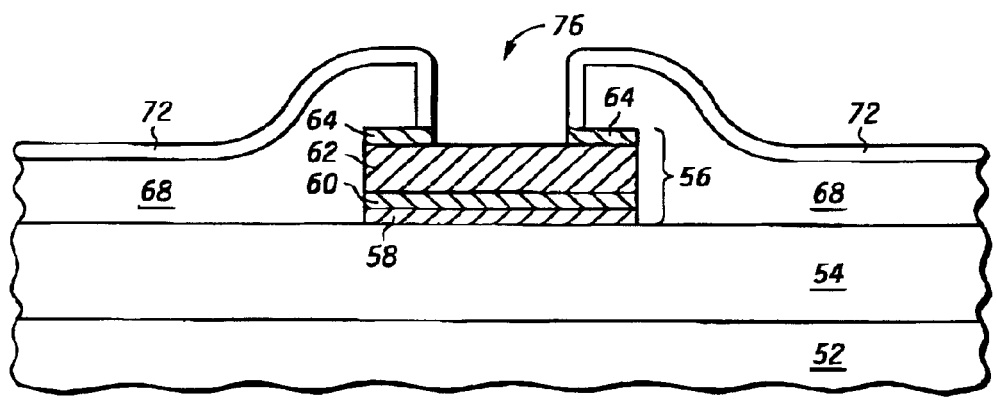
FIG. 6 illustrates the semiconductor device of FIG. 5 after removing a portion of the protective layer to form a bond pad structure.

After forming the first opening 70, a polymide layer 72 is formed 30 over the semiconductor device 50 that includes the semiconductor substrate 52. As shown in FIG. 5, the polymide layer 72 is patterned 32 to remove the portion of the polyimide layer from the bottom of a second opening 74 to expose a portion the top-most layer 64. (The second opening 74 is concentric with the first opening 72.) However, portions of the polyimide that remain on the sidewalls of the second opening 72 remain. To remove the polyimide layer 72 form the bottom of the second opening a directional etch is performed. The polyimide layer 72 can be patterned using either positive of negative polyimide, which are nonphotosensitive and photosensitive, respectively. When using a negative polyimide the portions that are exposed to UV (ultraviolet) rays remains and the non-exposed portions are removed or cleared. In contrast, when using a positive polyimide the portions that are exposed to UV rays are removed and the portions that are not exposed remain. Regardless of the type of polyimide used, TMAH removes undesirable portions of the polyimide layer. Thus, when using negative polyimide TMAH is used to remove the non-exposed portions and when using positive polyimide the TMAH removes the exposed areas. (The TMAH removes both the resist and the polyimide.)

As shown in FIG. 1, the exposed portion of the top-most layer 64 is removed 34 from the second opening without substantially removing the bond pad layer 62 and the polyimide 72 to form a third opening 76. (The third opening 76 is concentric with the first and second openings 72 and 74.) In other words, the top-most layer 64 is selectively etched with respect to the bond pad layer 62 and the polyimide 72. The removal process is a wet strip, meaning that liquid chemicals are used to selectively remove the top-most layer 64, which is preferably TiN. Thus, no plasma is present.

The chemistry used is preferably a ratio of 20:1 to 100:1 of hydrogen peroxide ($H_2O_2$):ammonium hydroxide ($NH_4OH$). The hydrogen peroxide does not attack the surface of the bond pad layer 62, which is preferably aluminum. The ammonium hydroxide controls the OH ions. The more ammonium hydroxide that is present the faster the top-most layer 64 is etched and thus, the increase in cycle time of processing. Thus, a ratio of 20:1 etches faster than 100:1. Alternatively, the ammonium hydroxide can be replaced with any amine. In addition, 100% hydrogen peroxide can be used however the etch will be very slow.

The duration of the etch also depends on the thickness of the top-most layer 64. For example, using a concentration of 100:1 at 50 degrees Celsius will take approximately 10 minutes to etch through 600 Angstroms of the top-most layer 64.

The etch is preferably performed in a temperature range of approximately 20–60 degrees Celsius, or more preferably between 40–60 degrees Celsius. At temperatures greater than 60 degrees Celsius it is very likely that the underlying bond pad layer 60 will undesirably be attacked.

After removing 34 the top-most layer 64, data is collected 36 to determine a remaining thickness of the top-most layer 64. In one embodiment, a metapulse tool is used; any other process or tool can be used. The data collection is optional, but can be used to monitor the performance of the process, if desired. If the data collection is not performed the process reduces cost and increases cycle time.

Another benefit of using the process described herein is that reliability is improved to a level where bondability tests are not needed. Removing a process in a flow is desirable because it decreases cycle time and costs.

Customers who buy semiconductor chips have requirements as to the thickness of the bond pad layer due to the thickness' affect on reliability. Typically, automotive customers have rigorous reliability requirements since many semiconductor chips are placed in high temperature environments, such as near automotive engines. (Higher temperature environments increase the reliability requirements.) By using the process described herein to form the bond pad, the thickness of the bond pad layer after fabrication meets the rigorous automotive requirements.

If the polyimide layer is formed incorrectly or was not developed/pattered soon after it was formed, it may need to be removed and then re-formed. Such a process is called a redo because it repeats the formation of the polyimide layer. Because the top-most layer protects the bond pad layer when forming the polyimide layer, the polyimide can be removed and redeposited without exposing the bond pad layer and thus, preventing the reduction in thickness of the bond pad layer. In other words, the presence of the top-most layer prevents polyimide redos from diminishing the reliability of the subsequently formed bond pad. Furthermore, the ability to perform polyimide redos reduces scrap.

Because the bond pad layer is not etched when removing the top-most layer, decontamination of the bond pad layer is reduced from other processes. In addition, the bond pad layer is less likely to be undercut under the passivation, which decreases reliability. In addition, the process described herein allows for control of the bond pad layer thickness, is a stable process and does not corrode the bond pads.

In the foregoing specification, the invention has been described with reference to specific embodiments. However, one of ordinary skill in the art appreciates that various modifications and changes can be made without departing from the scope of the present invention as set forth in the claims below. For example, the material and thicknesses listed are not requirements. In addition, although only one bond pad was discussed a skilled artisan recognizes that a plurality of bond pads may be fabricated in any pattern to form a semiconductor device. Accordingly, the specification and figures are to be regarded in an illustrative rather than a restrictive sense, and all such modifications are intended to be included within the scope of the present invention.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term plurality, as used herein, is defined as two or more than two. The term another, as used herein, is defined as at least a second or more. The term coupled, as used herein, is defined as connected, although not necessarily directly, and not necessarily mechanically.

What is claimed is:

1. A method of forming a bond pad, the method comprising:
   providing semiconductor substrate;
   forming a bond pad layer over the semiconductor substrate;
   forming a protection layer over the bond pad layer;
   forming a polyimide layer over the protection layer;
   pattering the polyimide layer to form an opening; and
   removing a portion of the protection layer using an etch chemistry comprising hydrogen peroxide and an amine, wherein removing the portion of the protective layer is performed after patterning the polyimide layer and the removing is selective to the bond pad layer and the polyimide layer.

2. The method of claim 1 wherein the amine is ammonium hydroxide.

3. The method of claim 2, wherein the etch chemistry consists of hydrogen peroxide and ammonium hydroxide.

4. The method of claim 1, wherein the ratio of the hydrogen peroxide to amine is between 20:1 and 100:1.

5. The method of claim 1, wherein forming a protection layer further comprises forming a protection layer comprising titanium and nitrogen.

6. The method of claim 1, wherein forming a bond pad layer further comprises forming a bond pad layer comprising aluminum.

7. A method of forming a bond pad, the method comprising:
   providing semiconductor substrate;
   forming a bond pad layer over the semiconductor substrate;
   forming a protection layer over the bond pad layer;
   forming a polyimide layer over the protection layer;
   patterning the polyimide layer to form an opening; and
   removing a portion of the protection layer using an etch chemistry comprising of hydrogen, oxygen and nitrogen, wherein removing the portion of the protective layer is performed by selectively removing the portion of the protective layer so not to remove substantial portions of the bond pad layer and the polyimide layer.

8. The method of claim 7, wherein the etch chemistry comprises hydrogen peroxide and an amine.

9. The method of claim 8, wherein the ratio of the hydrogen peroxide to amine is between 20:1 and 100:1.

10. The method of claim 9, wherein forming the protection layer further comprises forming a protection layer comprising titanium and nitrogen.

11. The method of claim 10, wherein forming the protection layer further comprises forming a titanium nitride protection layer.

12. The method of claim 9, wherein forming a bond pad layer further comprises forming a bond pad layer comprising aluminum.

13. A method of forming a bond pad, the method comprising:
   providing a semiconductor substrate;
   forming a bond pad layer over the semiconductor substrate;
   forming a protective layer over the bond pad layer;
   patterning the bond pad layer and the protective layer to form a stack;
   forming a passivation layer over the semiconductor substrate;
   patterning the passivation layer to form a first opening over a portion of the stack;
   forming a polyimide layer over the semiconductor substrate and along the bottom and sidewalls of the first opening after patterning the passivation layer;
   patterning the polyimide layer to form a second opening over the stack, wherein the second opening is concentric with the first opening and the second opening exposes a portion of the protective layer;
   selectively removing the exposed portion of the protective layer from the second opening by using a chemistry comprising hydrogen, oxygen, and nitrogen.

14. The method of claim 13, wherein the etch chemistry comprises hydrogen peroxide and an amine.

15. The method of claim 14, wherein the ratio of the hydrogen peroxide to amine is between 20:1 and 100:1.

16. The method of claim 13, wherein forming a protection layer further comprises forming a protection layer comprising titanium and nitrogen.

17. The method of claim 16, wherein forming the protection layer further comprises forming titanium nitride protection layer.

18. The method of claim 13, wherein forming a bond pad layer further comprises forming a bond pad layer comprising aluminum.

* * * * *

UNITED STATES PATENT AND TRADEMARK OFFICE
CERTIFICATE OF CORRECTION

PATENT NO. : 6,924,172 B2
APPLICATION NO. : 10/649426
DATED : August 2, 2005
INVENTOR(S) : Thomas S. Roche et al.

It is certified that error appears in the above-identified patent and that said Letters Patent is hereby corrected as shown below:

<u>Title page, Item [54] and Column 1, line 1,</u>
Title, change "METHOD OF FORMING A BOND PAD" to -- METHOD OF FORMING A BOND PAD INCLUDING REMOVING A PORTION OF A PROTECTIVE LAYER --.

Signed and Sealed this

Twentieth Day of June, 2006

JON W. DUDAS
*Director of the United States Patent and Trademark Office*